(12) United States Patent
Eastman et al.

(10) Patent No.: US 10,784,104 B2
(45) Date of Patent: Sep. 22, 2020

(54) INTERFACIAL CONTROL OF OXYGEN VACANCY DOPING AND ELECTRICAL CONDUCTION IN THIN FILM OXIDE HETEROSTRUCTURES

(71) Applicant: UCHICAGO ARGONNE, LLC, Chicago, IL (US)

(72) Inventors: Jeffrey A. Eastman, Argonne, IL (US); Boyd W. Veal, Argonne, IL (US); Peter Zapol, Argonne, IL (US)

(73) Assignee: UChicago Argonne, LLC, Chicago, IL (US)

( * ) Notice: Subject to any disclaimer, the term of this patent is extended or adjusted under 35 U.S.C. 154(b) by 110 days.

(21) Appl. No.: 16/004,175

(22) Filed: Jun. 8, 2018

(65) Prior Publication Data
US 2018/0358224 A1  Dec. 13, 2018

Related U.S. Application Data

(60) Provisional application No. 62/517,809, filed on Jun. 9, 2017.

(51) Int. Cl.
*H01L 21/02* (2006.01)
*H01L 21/28* (2006.01)
(Continued)

(52) U.S. Cl.
CPC ...... *H01L 21/02241* (2013.01); *H01L 21/182* (2013.01); *H01L 21/28264* (2013.01); *H01L 21/28581* (2013.01); *H01L 45/00* (2013.01)

(58) Field of Classification Search
CPC ............. H01L 21/02241; H01L 21/182; H01L 21/28264; H01L 21/28581; H01L 45/00
See application file for complete search history.

(56) References Cited

U.S. PATENT DOCUMENTS

| 4,258,080 A * | 3/1981 | Sonoda ................... H01L 45/00 252/518.1 |
| 2003/0221975 A1 * | 12/2003 | Mizutani ............ G01N 27/4074 205/784 |

(Continued)

FOREIGN PATENT DOCUMENTS

| JP | 04348268 A | * 12/1992 |
| WO | WO-2015/139033 A1 | 9/2015 |

OTHER PUBLICATIONS

Agoston, et al., "Intrinsic n-Type Behavior in Transparent Conducting Oxides: A Comparative Hybrid-Functional Study of In2O3, SnO2, and ZnO," Physical Review Letters 103, 245501, 4 pages (2009).

(Continued)

*Primary Examiner* — Allan R Wilson
(74) *Attorney, Agent, or Firm* — Foley & Lardner LLP

(57) ABSTRACT

Systems and methods of reversibly controlling the oxygen vacancy concentration and distribution in oxide heterostructures consisting of electronically conducting $In_2O_3$ films grown on ionically conducting $Y_2O_3$-stabilized $ZrO_2$ substrates. Oxygen ion redistribution across the heterointerface is induced using an applied electric field oriented in the plane of the interface, resulting in controlled oxygen vacancy (and hence electron) doping of the film and possible orders-of-magnitude enhancement of the film's electrical conduction. The reversible modified behavior is dependent on interface properties and is attained without cation doping or changes in the gas environment in contact with the sample.

13 Claims, 10 Drawing Sheets

(51) Int. Cl.
    *H01L 45/00*     (2006.01)
    *H01L 21/285*     (2006.01)
    *H01L 21/18*     (2006.01)

(56) References Cited

U.S. PATENT DOCUMENTS

2005/0236271 A1* 10/2005 Izu .................. G01N 27/12
    204/424
2016/0231303 A1* 8/2016 Park ................. G01N 33/2841

OTHER PUBLICATIONS

Bak, et al., "Electrical conductivity of indium sesquioxide thin film," Journal of Materials Science: Materials in Electronics 13(10), pp. 571-579 (2002).

Basletic, et al,. "Mapping the spatial distribution of charge carriers in LaAlO3/SrTiO3 heterostructures," Nature Materials 7, pp. 621-625 (2008).

Bierwagen & Speck, "Nucleation of islands and continuous high-quality In2O3(001) films during plasma-assisted molecular beam epitaxy on Y-stabilized ZrO2(001)," Journal of Applied Physics 107(11), 113519, 7 pages (2010).

Blochl, "Projector augmented-wave method," Physical Review B 50(24), pp. 17953-17979 (1994).

Bourlange, et al., "Growth of In2O3(100) on Y-stabilized ZrO2(100) by O-plasma assisted molecular beam epitaxy," Applied Physics Letters 92(9), 092117 (2008).

Bourlange, et al., "Investigation of the growth of In2O3 on Y-stabilized ZrO2(100) by oxygen plasma assisted molecular beam epitaxy," Thin Solid Films 517(15), pp. 4286-4294 (2009).

Brinkman, et al., "Magnetic effects at the interface between non-magnetic oxides," Nature Materials 6, pp. 493-496 (2007).

Bristowe, et al., "Surface defects and conduction in polar oxide heterostructures," Physical Review B 83, 205405, 6 pages (2011).

Bronin, et al,. "Polarized-cell measurements on yttria-stabilized zirconia using an anodically blocked electrode," Journal of the Electrochemical Society 146(6), pp. 2034-2037 (1999).

Chen, et al., "A high-mobility two-dimensional electron gas at the spinel/perovskite interface of gamma-Al2O3/SrTiO3," Nature Communications 4, 1371, 6 pages (2013).

Chen, et al., "Electronic Activation of Cathode Superlattices at Elevated Temperatures—Source of Markedly Accelerated Oxygen Reduction Kinetics," Advanced Energy Materials 3(9), pp. 1221-1229 (2013).

Chen, et al., "Metallic and Insulating Interfaces of Amorphous SrTiO3-Based Oxide Heterostructures," Nano Letters 11(9), pp. 3774-3778 (2011).

Crumlin, et al., "Surface strontium enrichment on highly active perovskites for oxygen electrocatalysis in solid oxide fuel cells," Energy & Environmental Science 5, pp. 6081-6088 (2012).

Dixit, et al., "Robust room temperature persistent photoconductivity in polycrystalline indium oxide films," Applied Physics Letters 94, 252105, 3 pages (2009).

Esch, et al., "Electron localization determines defect formation on ceria substrates," Science 309(5735), pp. 752-755 (2005).

Falgairette & Foti, "Oxygen storage in O2/Pt/YSZ cell," Catalysis Today 146(3-4), pp. 274-278 (2009).

Foti, et al., "Charge storage at the Pt/YSZ interface," Journal of Electroceramics 23(175), (2007).

Goswami & Goswami, "A. C. behaviour and dielectric relaxation in indium oxide films," Pramana 8(4), pp. 335-347 (1977).

Hebb, "Electric conductivity of silver sulfide," The Journal of Chemical Physics 20, 185, (1952).

Horlein, et al., "On the variability of oxygen exchange kinetics of platinum model electrodes on yttria stabilized zirconia," Solid State Ionics 247-248, pp. 56-65 (2013).

Jalil, et al., "New Insights into the Strain Coupling to Surface Chemistry, Electronic Structure, and Reactivity of La0.7Sr0.3MnO3," The Journal of Physical Chemistry Letters 2(7), pp. 801-807 (2011).

Jeen, et al., "Orienting Oxygen Vacancies for Fast Catalytic Reaction," Advanced Materials 25(44), pp. 6459-6463 (2013).

Jeong, et al., "Suppression of Metal-Insulator Transition in VO2 by Electric Field-Induced Oxygen Vacancy Formation," Science 339(6126), pp. 1402-1405 (2013).

Kresse & Furthmuller, "Efficiency of ab-initio total energy calculations for metals and semiconductors using a plane-wave basis set," Computational Materials Science 6(1), pp. 15-50 (1996).

Kresse & Furthmuller, "Efficient iterative schemes for ab initio total-energy calculations using a plane-wave basis set," Physical Review B 54(16), pp. 11169-11186 (1996).

Lee, et al., "Creation and Control of Two-Dimensional Electron Gas Using Al-Based Amorphous Oxides/SrTiO3 Heterostructures Grown by Atomic Layer Deposition," Nano Letters 12(9), pp. 4775-4783 (2012).

Li, et al., "Coexistence of magnetic order and two-dimensional superconductivity at LaAlO3/SrTiO3 interfaces," Nature Physics 7, pp. 762-766 (2011).

Lin & Demkov, "Consequences of Oxygen-Vacancy Correlations at the SrTiO3 Interface," Physical Review Letters 113, 157602, 8 pages (2014).

Liu, et al., "Origin of the Two-Dimensional Electron Gas at LaAlO3/SrTiO3 Interfaces: The Role of Oxygen Vacancies and Electronic Reconstruction," Physical Review X 3, 021010, 9 pages (2013).

Luo, et al., "Investigating the mechanism of catalytic reduction of silver nitrate on the surface of barium titanate at room temperature: oxygen vacancies play a key role," RSC Advances 5, pp. 3377-3380 (2015).

Norby & Hartmanova, "Electrical conductivity and ionic transport Number of YSZ and Cr-doped YSZ single crystals at 200-1000 C," Solid State Ionics 67(1-2), pp. 57-64 (1993).

Ohta, et al., "Highly electrically conductive indium-tin-oxide thin films epitaxially grown on yttria-stabilized zirconia (100) by pulsed-laser deposition," Applied Physics Letters 76(19), 2740, (2000).

Ohtomo & Hwang, "A high-mobility electron gas at the LaAlO3/SrTiO3 heterointerface," Nature 427, pp. 423-426 (2004).

Pavlenko, et al., "Emerging magnetism and electronic phase separation at titanate interfaces," Physical Review b 88, 201104, 5 pages (2013).

Pavlenko, et al., "Magnetic and superconducting phases at the LaAlO3/SrTiO3 interface: The role of interfacial Ti 3d electrons," Physical Review B 85, 020407, 5 pages (2012).

Perdew & Wang, "Accurate and simple analytic representation of the electron-gas correlation-energy," Physical Review B 45(23), 13244, 6 pages (1992).

Predith, et al., "Ab initio prediction of ordered ground-state structures in ZrO(2)—Y(2)O(3)," Physical Review B 77(14), 144104, 7 pages (2008).

Salluzzo, et al., "Origin of Interface Magnetism in BiMnO3/SrTiO3 and LaAlO3/SrTiO3 Heterostructures," Physical Review Letters 111, 087204, 5 pages (2013).

Sasaki, et al., "Electronic Conductivity in In2O3 Solid-Solutions with ZrO2," Journal of the Electrochemical Society 141(10), pp. 2759-2768 (1994).

Sase, et al., "Enhancement of oxygen exchange at the hetero interface of (La,Sr)CoO3/(La,Sr)2CoO4 in composite ceramics," Solid State Ionics 178(35-36), pp. 1843-1852 (2008).

Sase, et al., "Enhancement of Oxygen Surface Exchange at the Hetero-interface of (La,Sr)CoO3/(La,Sr)2CoO4 with PLD-Layered Films," Journal of the Electrochemical Society 155(8), pp. B793-B797 (2008).

Schladt, et al., "Crystal-Facet-Dependent Metallization in Electrolyte-Gated Rutile TiO2 Single Crystals," ACS Nano 7(9), pp. 8074-8081 (2013).

Siegel, et al., "In situ characterization of the formation of a mixed conducting phase on the surface of yttria-stabilized zirconia near Pt electrodes," Physical Review B 92, 125421, (2015).

(56) References Cited

OTHER PUBLICATIONS

Stancovski, et al., "Thermodynamic Stability and Interfacial Impedance of Solid-Electrolyte Cells with Noble-Metal Electrodes," Journal of Electroceramics 3(3), pp. 279-299 (1999).
Von Wenckstern, et al., "Schottky contacts to In2O3," APL Materials 2, 046104, 7 pages (2014).
Yang, et al., "Oxide Heterostructure Resistive Memory," Nano Letters 13(6), pp. 2908-2915 (2013).
Younis, et al., "Oxygen level: the dominant of resistive switching characteristics in cerium oxide thin films," Journal of Physics D: Applied Physics 45(35), 6 pages (2012).

\* cited by examiner

INTERFACIAL CONTROL OF OXYGEN VACANCY DOPING AND ELECTRICAL CONDUCTION IN THIN FILM OXIDE HETEROSTRUCTURES

CROSS-REFERENCE TO RELATED APPLICATIONS

This application claims priority to and the benefit of U.S. Provisional Patent Application No. 62/517,809, filed Jun. 9, 2017, the content of which is herein incorporated by reference in its entirety.

GOVERNMENT SUPPORT CLAUSE

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to methods relating to thin films and oxygen vacancy control.

BACKGROUND

The discovery of a wide range of remarkable behaviors in thin film oxide heterostructures has led to intense interest in their synthesis and characterization. Oxygen vacancy concentrations exceeding bulk levels near surfaces and interfaces have recently been cited as instrumental in controlling these behaviors. For example, localized metallic conduction near heterointerfaces between bulk oxide insulators (e.g., $LaAlO_3/SrTiO_3$) has been interpreted by several authors to be due to vacancy doping of $SrTiO_3$ substrates during thin film deposition. Large changes in electrical resistance associated with metal-insulator transitions or resistive switching behavior have also been linked to increased oxygen vacancy concentrations in thin film heterostructures. Magnetism in thin film heterostructures of bulk non-magnetic materials has been attributed to the presence of oxygen vacancies near interface and catalytic activity of oxide heterostructures has been explained by enhanced interfacial oxygen vacancy concentration. These examples demonstrate the importance of being able to manipulate oxygen vacancies to achieve emergent behavior, motivating the exploration of new ways to control vacancy concentrations and distributions in oxide thin film heterostructures.

Attempts have been made to control oxygen vacancy concentration by changing $O_2$, but that requires changing the case environment of the system. Other attempts have focused on cation doping, particularly by substituting an aliovalent cation, but those techniques are irreversible. Another attempt has looked at applying potential normal to a surface, but the vacancy concentration only changes when a conducting electrolyte is present.

SUMMARY

Embodiments described herein relate generally to systems and methods for dynamic and reversible oxygen vacancy doping and controllable enhanced electronic conduction in oxide heterostructures, without requiring changes in cation composition or the gas environment in contact with the sample.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 5A shows the conductance response when the chamber $pO_2$ was changed from 15 to 150 Torr. FIG. 5B shows the response when the $pO_2$ was changed from 150 to 15 Torr. In both cases, n-type behavior is observed. Arrows indicate the time when the $pO_2$ change occurred.

Figure 1:
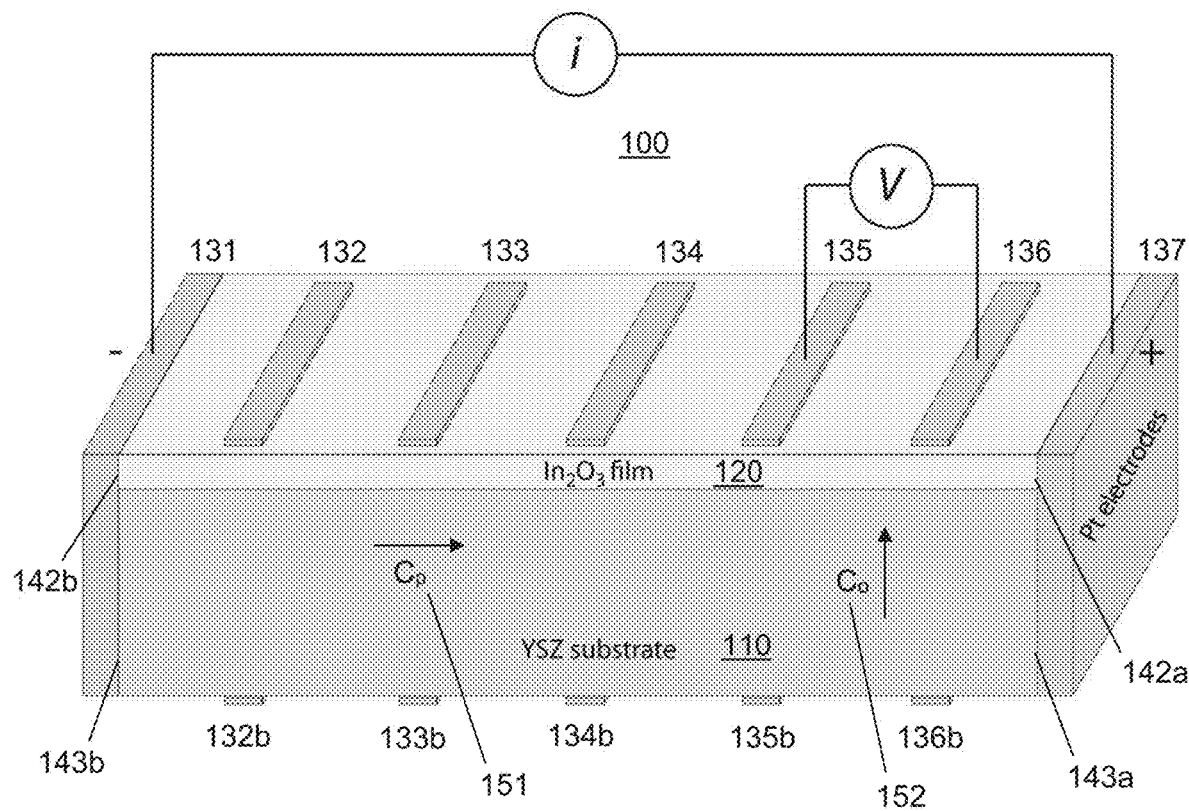
FIG. 1 is a sample schematic. End (current) electrodes were applied using Pt or Ag paint. Equally spaced Pt parallel line electrodes (voltage pick-offs) were sputter deposited through a shadow mask on both the $In_2O_3$ film (2-6) and YSZ substrate (2b-6b) surfaces.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to oxygen vacancy doping and thin films. Specifically, methods and systems are described for achieving a dynamic and reversible oxygen vacancy doping and controllable enhanced electronic conduction in oxide heterostructures, without requiring changes in cation composition or the gas environment in contact with the sample. A voltage component in the direction normal to an interface plane is achieved without applying a voltage in that direction, i.e. the direction of the applied field is in the plane of the interface, but a voltage component develops that is normal to the direction of the applied field. Therefore, in one embodiment an equivalent property-changing voltage can be attained without requiring the placement of electrodes on the surfaces "above" and "below" the interface plane. This allows for free design of the space that would be parallel to the surface. As a non-limiting example, devices could be manufactured using the described methods and structure where chemical reactions are taking place on a surface. In the prior art, the reaction would be blocked from proceeding if an electrode, necessary for the voltage component that is "normal" to the surface, was blocking the surface from contacting the reactants. Another non-limiting example, an optical device may use a film with changing optical properties caused by interaction with the film by changing the vacancy content of the film. The prior art would an electrode position on a surface parallel to the interface plane.

One embodiment for controlling oxygen consists of an epitaxial thin film of $In_2O_3$ grown on the (001) surface of a $Y_2O_3$-stabilized $ZrO_2$ (YSZ) substrate. This thin film is described herein for illustrative purposes as a model heterostructure. In one embodiment, a ionic conductor and an electronically dopable material are provided and have an interface therebeween.

FIG. 1 shows the heterostructure and electrode geometry. An oxide semiconductor layer 120 and an oxygen ion conductor substrate 110 form a heterostructure 100. A first electrode 131 engages both the layer 120 and the substrate 110 as does a second electrode 137 separate from the first electrode 131, such as at an opposite end. In one embodiment, such as illustrated in FIG. 1, $In_2O_3$ is an oxide semiconductor, exhibiting n-type conductivity. In contrast, YSZ is a fast oxygen ion conductor with negligible electronic conductivity. The <2% misfit strain between bixbyite-structured $In_2O_3$ and fluorite-structured YSZ enables the growth of epitaxial single crystal films with a cube-on-cube orientation relationship between the film and substrate. As shown in FIG. 1, the potential is applied in the plane of the interface (of the $In_2O_3$ and the YSZ substrate). A voltage component arises orthogonal to this applied field direction, i.e. orthogonal to the plane of the interface. This orthogonal voltage component allows for reversible driving of ions across the interface, thus into/out of the $In_2O_3$ thin film. The YSZ acts as a source/sink of oxygen as the vacancies are controlled. FIG. 1 also shows electrodes 131, 137. It should be appreciated that positive electrode 137 and negative electrode 131 are utilized to apply the current parallel ($C_p$) 151 to the heterointerface 141. FIG. 1 also shows 5 pairs of sampling electrodes 132a, 132b, 133a, 133b, 134a, 134b 135a, 135b 136a, and 136b. These electrodes are referenced herein for proof of concept to demonstrate the described generated orthogonal current ($C_o$) 152, but the respective exposed surfaces of the substrate and semiconductor layer may be free of an electrode.

Figure 2A:
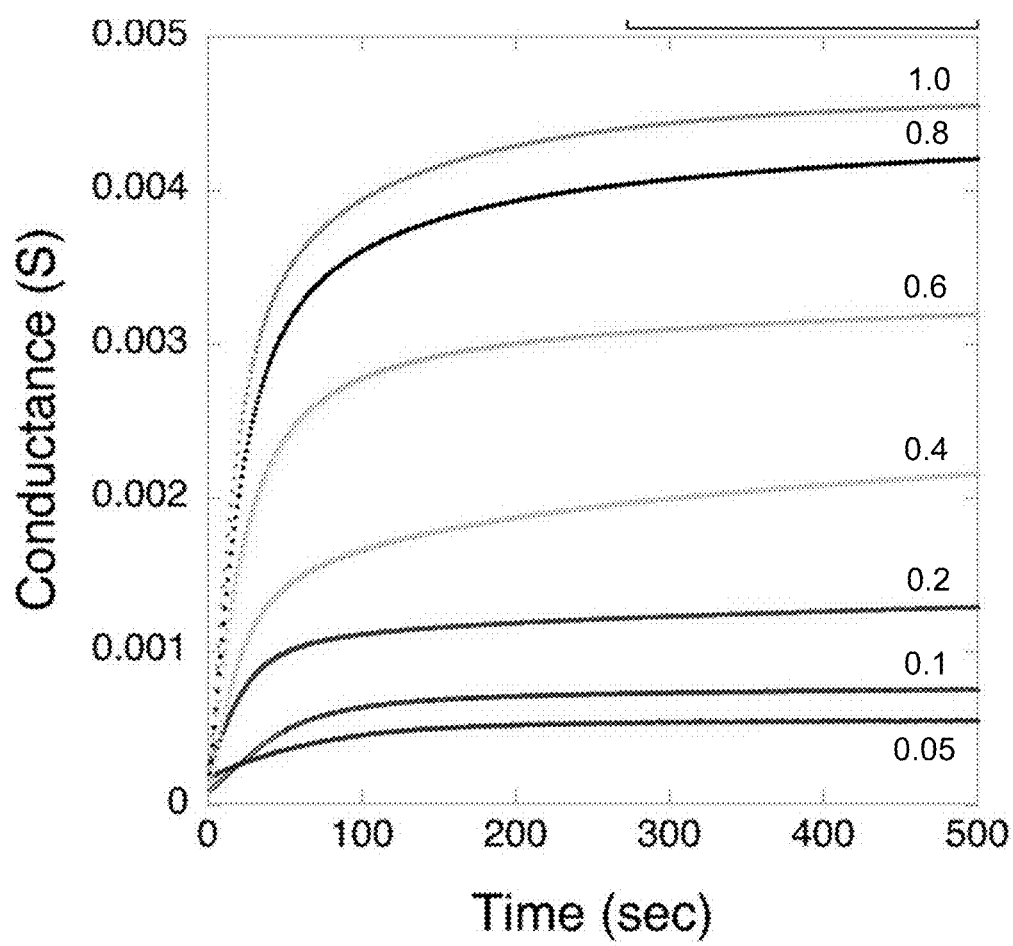
FIG. 2A: Measured electrical conductance versus time, at 300° C. and $pO_2$=1.5 Torr, for a 20 nm thick epitaxial $In_2O_3$ film on a (001) YSZ substrate. The sample was exposed to a constant field by maintaining the voltage indicated in the legend between electrodes 135 and 136 while flowing current between electrodes 131 and 137 (electrode configuration shown in FIG. 1).
Figure 2B:
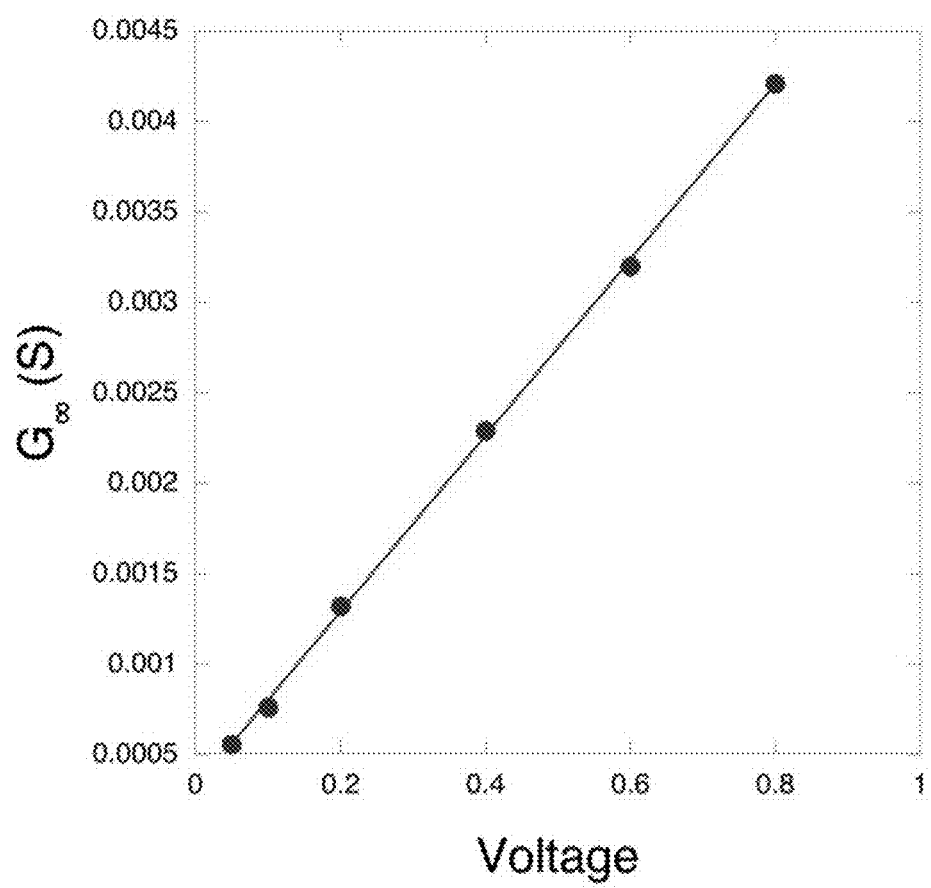
FIG. 2B: The steady state enhanced conductance shows a linear dependence on the voltage maintained between the pick-off electrodes under constant field conditions.

Using the heterostructure design illustrated in FIG. 1, we monitored the conductance response, using a 4-electrode technique, when small DC fields were applied in the plane of the film under constant current or constant voltage conditions. Herein, "small" DC field means 0.1 to 10 v/cm, and in further embodiments 0.8 to 1.2 v/cm and more specifically about 1 v/cm. Surprisingly, in all cases when samples were exposed to small DC fields, the conductance rose monotonically with time to a steady state value (FIG. 2A). While the magnitude of the initial and steady state conductances varied in different samples, presumably due to subtle differences in sample history, all samples showed qualitatively the same behavior under field exposure. The magnitude of the steady state conductance was observed to increase linearly with the field strength for fields less than approximately 5V/cm (FIG. 2B). For some samples, more than two orders-of-magnitude increase in conductance was observed for applied field strengths of only a few V/cm. Consistent behavior was observed under both constant current and constant voltage (field) conditions.

Figure 5A:
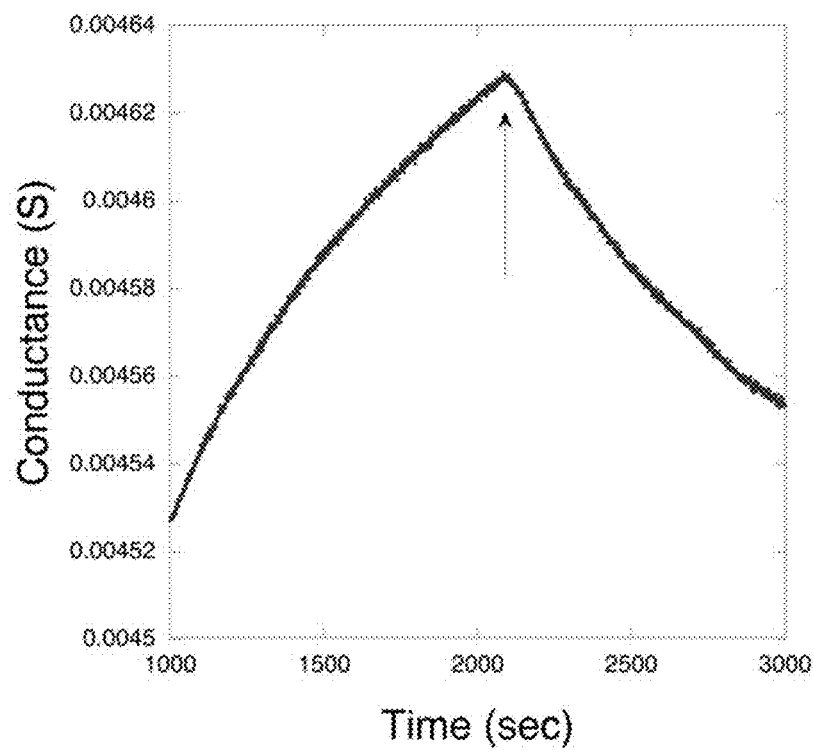
FIGS. 5A-B: The effect of changing $pO_2$ on the field-enhanced conductance is shown. A constant potential of 0.4V was maintained between electrodes 135 and 136.
Figure 5B:
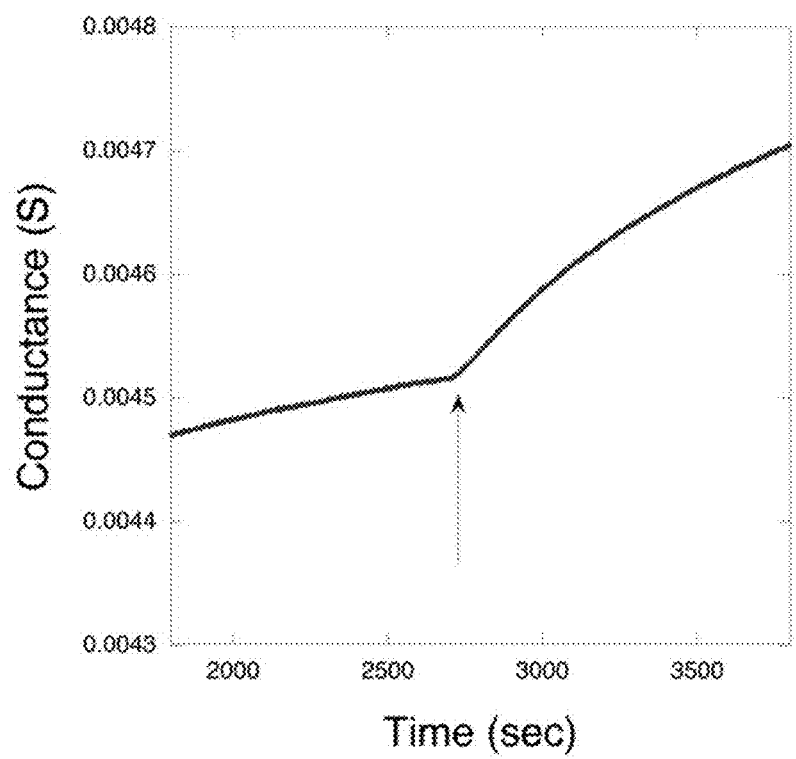
Figure 6:
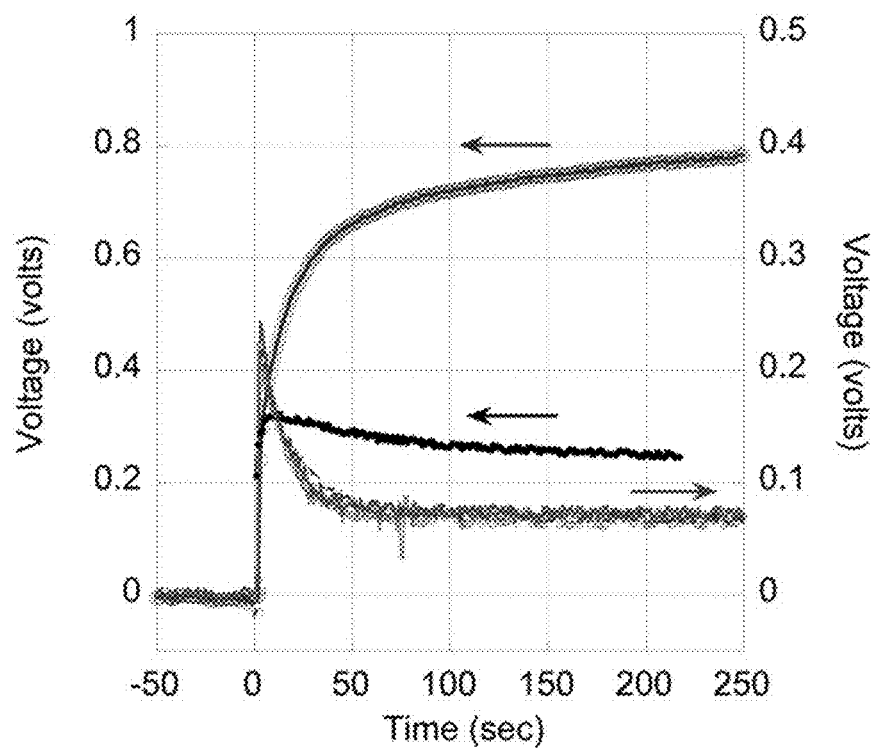
FIG. 6: Measurements of the field profile that develops in the ionically conducting YSZ substrate when a constant 1.6V potential is applied at time=0 between electrodes 131 (+) and 137 (−). The measurement temperature was 350° C. and the $pO_2$ was 1.5 Torr. Large voltage drops develop, with time, across electrodes 136-137 (top curve) where oxygen entry occurs, and across electrodes 131-132 (middle curve), where oxygen exit occurs. The electrode configuration is shown in FIG. 1. The contact resistances at terminals 1 and 7 increase with time, with steady state resistance to oxygen entry being largest. Identical, smaller voltage drops occur across electrodes 132-133, 133-134, 134-135, and 135-136 (other curves). As voltages across terminals 131-132 and 136-137 increase with time, voltages across the middle terminals must correspondingly decrease since the resistance of YSZ does not change with time.

The conductance enhancement was found to be reversible, returning to approximately the original value after removal of the field. The relative increase in conductance was observed to increase with decreasing film thickness (see Table below). This is an indication that the field-induced conduction enhancement is localized to a region in the films near the film/substrate heterointerface. The oxygen partial pressure ($pO_2$) of the sample environment was found to have a small effect on the behavior, with the magnitude of the steady state conduction decreasing with increasing $pO_2$, consistent with n-type behavior, as seen in FIGS. 5A and 5B. The magnitude of the field-induced conductance enhancement was also observed to increase with increasing sample temperature (FIG. 6).

| Thickness (nm) | $G_o \times \frac{L}{A}$ (S/cm) | $G_\infty \times \frac{L}{A}$ (S/cm) |
| --- | --- | --- |
| 4 | 10 | 600 |
| 16 | 14 | 300 |
| 70 | 11 | 60 |

The measured conductances of three samples with different thickness $In_2O_3$ films were compared at 400° C. when a constant 1V potential was maintained between the voltage pick-off electrodes. $G_o$ is the initial measured conductance when the field is applied, $G_\infty$ is the field-enhanced conductance at steady state, L is the distance between the pick-off electrodes, and A is the film thickness. The comparison indicates that the enhanced conduction resulting from the field application is highly localized to the $In_2O_3$/YSZ heterointerfacial region.

Further experiments were carried out to determine the mechanism responsible for the observed field-induced conductance increases. These measurements clearly demonstrate that the relaxation behavior, showing dramatic enhancement of the sample conduction, is determined by the response of multiple interfaces in the heterostructure to the application of small electric fields. There are five relevant interfaces in the heterostructure. In addition to the YSZ/$In_2O_3$ interface 141, electrode/YSZ interface 143a and electrode/$In_2O_3$ interface 142a at positive terminals 137, Pt/YSZ interface 142b and Pt/$In_2O_3$ interface 143b at negative terminal 131 must be considered. Four of these interfaces play important roles in response to the applied field. The electrode(Pt)/$In_2O_3$ interfaces at the voltage pickoffs do not contribute to the observed behavior since a four-electrode configuration is used and pickoff voltages are measured with a high input impedance voltmeter.

Oxygen ions in the ionically conducting YSZ substrate will migrate in an electric field, with oxygen ions attracted to the positive electrode and oxygen vacancies thus moving towards the negative electrode. Oxygen ions enter YSZ at three-phase boundaries at the negative electrode according to $O_2 (g) + 2V_O" 4e' \rightarrow 2O_O^x$, which is written using Kroger-Vink notation, where $V_O"$ indicates an oxygen vacancy with a +2 charge with respect to that of an oxygen ion, e' is an electron, and $O_O^x$ is an oxygen ion with a formal −2 valence sitting in an oxygen lattice site. Oxygen exits the sample at the positive electrode by the reverse reaction.

Figure 3A:
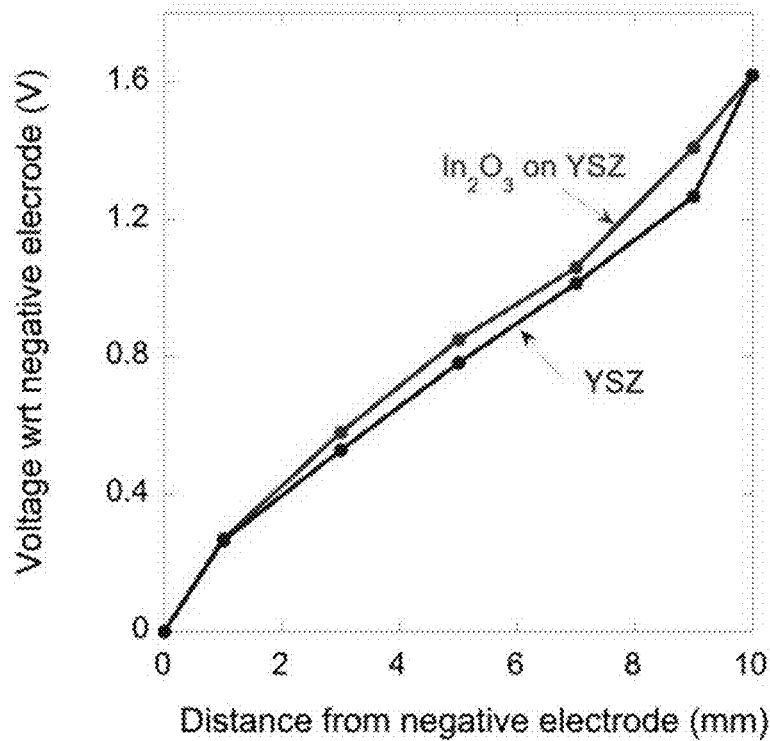
FIG. 3A: Initial voltage profile across a bare YSZ substrate compared to the profile across a 51 nm thick $In_2O_3$-on-YSZ sample when a 1.6 volt battery is connected to electrodes 131 and 137 at 350° C. No significant contact resistances are present initially.
Figure 3B:
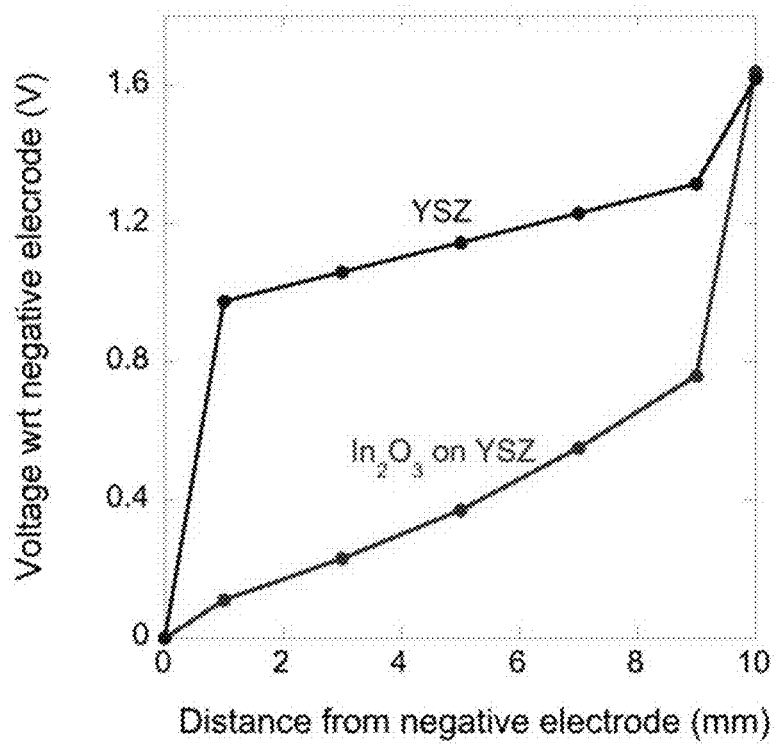
FIG. 3B: Voltage profiles after 5 minutes (at steady state) with a constant potential of 1.6V applied between electrodes 131 and 137 (electrode configuration described in FIG. 1) for the same two samples. For the bare YSZ substrate, a large contact resistance has developed at the negative terminal (where oxygen entry occurs). A smaller contact resistance appears at the positive terminal (oxygen exit). A Schottky-type resistance appears at the positive terminal of the $In_2O_3$-on-YSZ sample.
Figure 7:
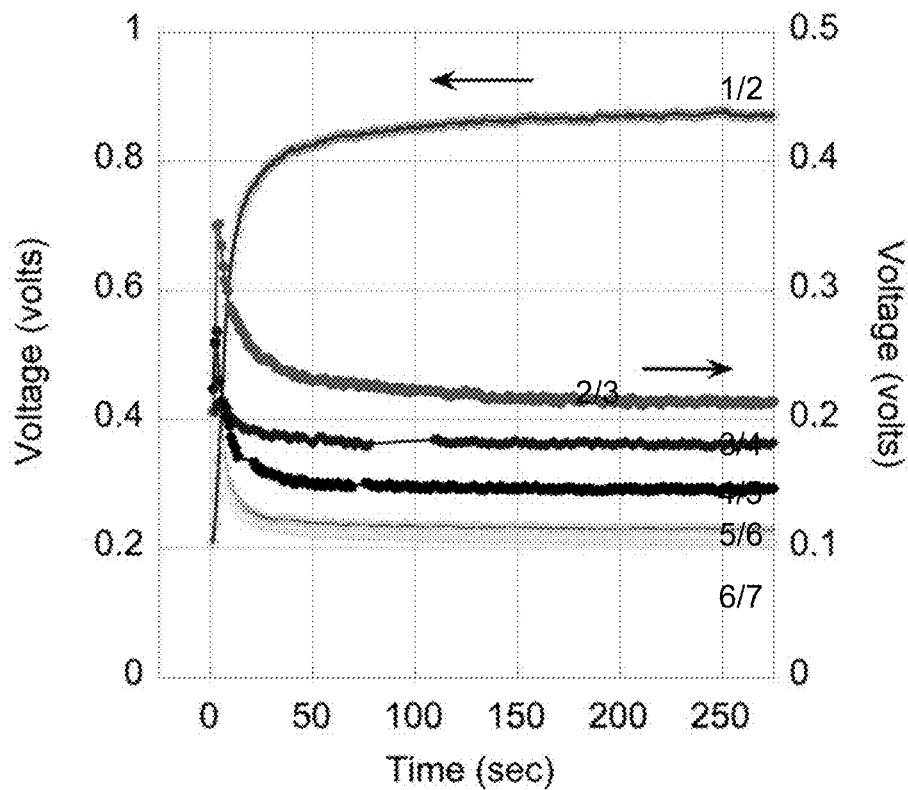
FIG. 7: Measurement of the development of the field profile in an $In_2O_3$-on-YSZ sample at 350° C., $pO_2$=1.5 Torr. Here, conduction is dominated by electrons. With a constant 1.6V applied between electrodes 131 (+) and 137 (−) at time=0, there is initially no observable contact resistance. However, with time, a Schottky resistance appears at the positive electrode. A Schottky resistance develops when oxygen vacancies are eliminated from the $In_2O_3$ film adjacent to the Pt positive electrode. The legend indicates which pair of electrodes is being monitored for each measurement shown Steady state voltage drops between adjacent electrodes systematically increase, progressing from the negative terminal to the positive terminal, revealing a conduction gradient.

When a DC voltage is applied across the end terminals (FIG. 1), a voltage profile is established laterally across the $In_2O_3$ that can be different from the lateral profile across the YSZ substrate. This can happen because YSZ is an ionic conductor and $In_2O_3$ is an electronic conductor. If there are no contact resistances, and samples are homogeneous, the profiles are identical. FIG. 3A shows the voltage profiles at time t=0, when the DC field is first applied, and FIG. 3B shows the profiles after relaxation to steady state has occurred. (The time dependent measurements, from which the profiles in FIGS. 3A and 3B were obtained, are shown in FIG. 7). The initial profiles are nearly identical, indicating that contact resistances are small at time zero, when the voltage is first applied. However, at steady state, the profiles have dramatically diverged. A large resistance has developed at the negative Pt electrode/YSZ interface (where oxygen entry occurs). A much smaller, but still significant resistance also develops at the positive Pt electrode/YSZ interface (where oxygen exit occurs). At the same time, a large resistance develops at the positive Pt electrode/$In_2O_3$ interface. No significant resistance develops at the negative Pt electrode/$In_2O_3$ terminal.

A Schottky barrier has been reported to develop at the heterointerface between $In_2O_3$ films and Pt electrodes when oxygen vacancies are eliminated from the region of the $In_2O_3$ film in contact with Pt. In the current experiment, a Schottky barrier will form as oxygen ions migrate towards the positive electrode under the influence of the applied field, eliminating oxygen vacancies from the $In_2O_3$ film near the $In_2O_3$/positive Pt electrode interface.

Figure 3C:
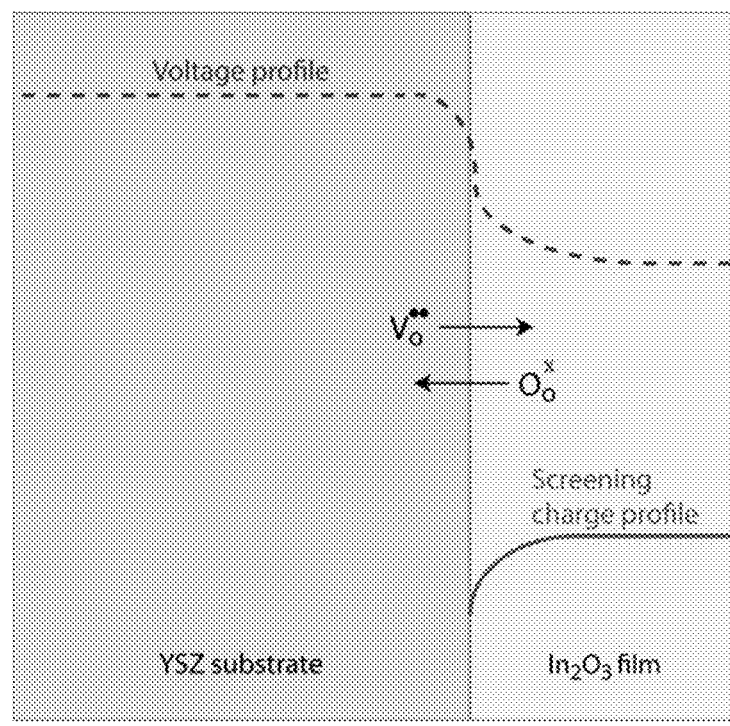
FIG. 3C: The voltage profile that develops across the YSZ/$In_2O_3$ interface causes oxygen ions to move across the interface from $In_2O_3$ to YSZ. This transport of oxygen across the interface limits the magnitude of the voltage difference between YSZ and $In_2O_3$. A screening charge appears in the $In_2O_3$ film near the interface. This interfacial electron doping increases the conductivity of the $In_2O_3$. In the YSZ, charge neutrality is maintained by mobile excess oxygen ions moving away from the interface (and towards the positive Pt electrode).

As a result of the interfacial resistances described above, a substantial voltage drop develops between the YSZ substrate and the $In_2O_3$ film. The voltage drop is concentrated at the interface, where ionic and electronic conductors meet, as shown in FIG. 3C. This component of the field, oriented normal to the interface, moves electrons in $In_2O_3$ and oxygen vacancies in YSZ towards the interface, and provides a driving force to move oxygen ions from the film to the substrate. As a result, enhanced electron doping of the $In_2O_3$ occurs within a relatively short distance, i.e., a screening length of approximately 4-8 nm, of the field-induced oxygen vacancies created near the interface, as discussed below. The rate at which this doping occurs is fixed by the rate at which the voltage across the YSZ/$In_2O_3$ heterointerface develops (i.e., the rate at which the resistance at the Pt/YSZ interfaces and the positive Pt/$In_2O_3$ interface develops).

To estimate the extent of the interfacial space-charge region, we used the expression for the Debye length, $L_D = \sqrt{(\varepsilon K_B T)/(v_0 e^2)}$, where $\varepsilon$ and $n_0$ are the dielectric constant and carrier concentration for the undoped (E=0) $In_2O_3$ film, $K_B$ is the Boltzmann constant, and T is the absolute temperature. Using $\sigma = n_0 e \mu$, with $\sigma = 10$ S/cm and $\mu = 50$ cm$^2$/V-sec, we obtain $n_0 = 10^{18}$/cm$^3$. According to Goswami et al., for $In_2O_3$ films, $\varepsilon$ is film thickness dependent with a value of about $60\varepsilon_0$ (giving $L_D = 11.3$ nm) for d>1500 Å, and varying between 10 $\varepsilon_0$ (where $L_D = 4$ nm) and 60 $\varepsilon_0$ for thinner films. Assuming $\varepsilon$ for our films has values in the range of 9-30 $\varepsilon_0$ gives an approximate Debye screening length of 4-8 nm.

Figure 8:
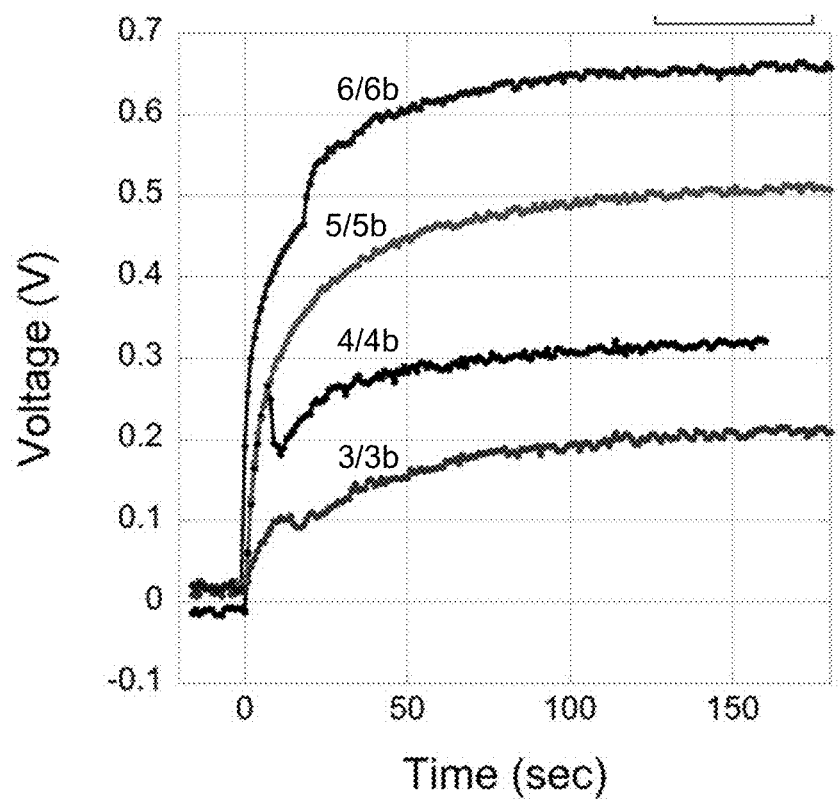
FIG. 8: With a 3.2V battery connected across electrodes 2 (+) and 6 (−), the voltage drop vertically across the sample (29 nm thick $In_2O_3$ film on YSZ) was measured at 5 positions (see FIG. 1 for electrode configuration; legend indicates which pair of top/bottom electrodes was used for each measurement). A positive voltage indicates that the substrate was at higher potential than the film. The temperature was 350° C. and the $pO_2$ was 1.5 Torr. At time t=0, the voltage drop is approximately zero, but rises with time when the battery is connected. The voltage drop across the YSZ/$In_2O_3$ interface increases from the positive to the negative end of the sample, giving rise to an observed conduction gradient.

The development of the potential across the $In_2O_3$/YSZ interface was confirmed by directly measuring the voltage between pairs of electrodes on the top and bottom surfaces of samples when a constant voltage was applied between the end electrodes (FIG. 8). The voltage across the $In_2O_3$/YSZ interface, approximately zero when the field was first applied, was observed to increase with time, showing approximately the same rate kinetics as the conductance changes shown in FIG. 2.

Figure 3D:
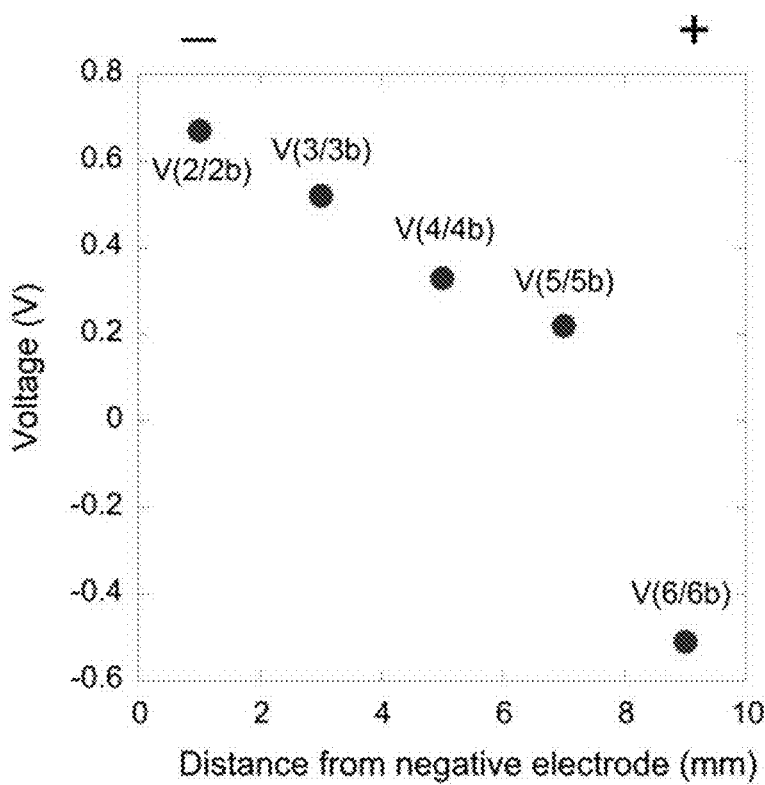
FIG. 3D: Direct measure of the voltage at steady state between various indicated pairs of top and bottom electrodes when a constant potential of 3.2 Volts is applied between electrodes 132 and 136 (electrode configuration shown in FIG. 1). The sample was a 29 nm $In_2O_3$ film on a YSZ substrate, measured at 350° C. in a $pO_2$=1.5 Torr environment.
Figure 9:
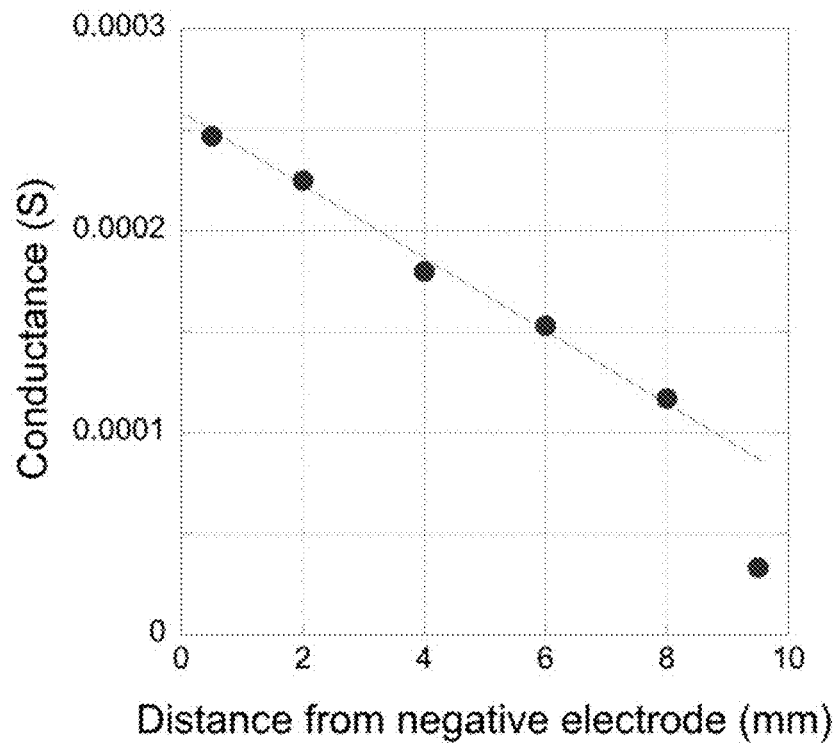
FIG. 9: The conductance gradient measured, with a constant current of 6E-5 Amps flowing between electrodes 131 and 137 (see FIG. 1 for electrode configuration). The sample was a 51 nm thick $In_2O_3$ film on YSZ measured at 400° C. in $pO_2$=1.5 Torr. As usual, there is no apparent contact resistance at the negative electrode, but there is a Schottky resistance at the positive electrode.
Figure 10:
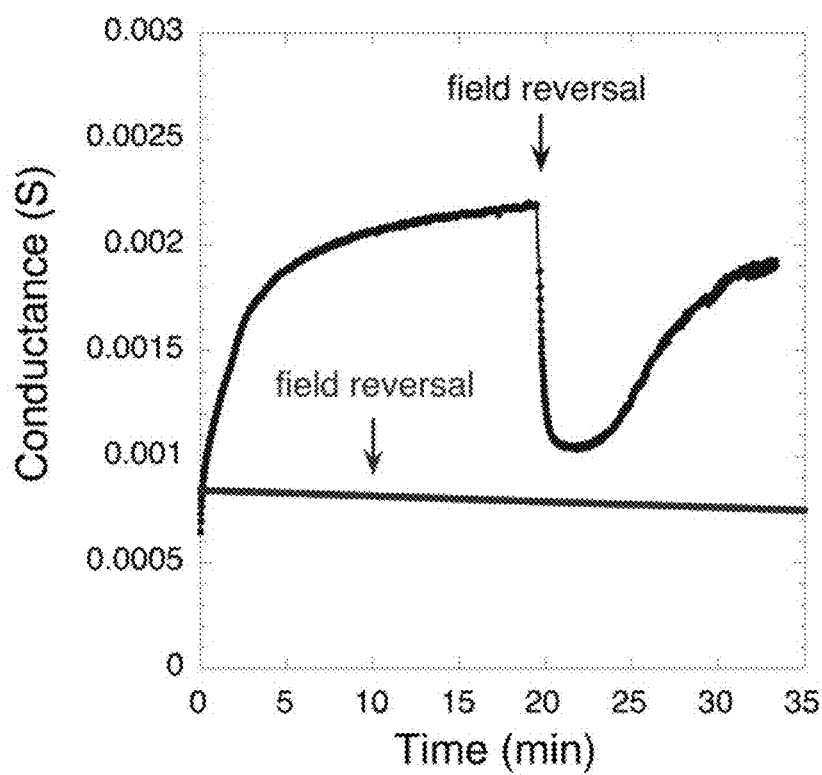
FIG. 10: The conductance versus time under constant current conditions is shown for $In_2O_3$-on-YSZ (top) and for $In_2O_3$-on-$MgAl_2O_4$ samples (bottom). The measurements were made at 350° C. and $pO_2$=1.5 Torr, using a constant current. The $In_2O_3$-on-$MgAl_2O_4$ sample shows a slow conductance drift with time, but no field-induced enhancement of the conduction. The field direction was reversed for both samples at the times indicated by the arrows. Transient behavior was observed for $In_2O_3$-on-YSZ, but the field reversal had no effect on the measured conductance of the $In_2O_3$-on-$MgAl_2O_4$.
Figure 11:
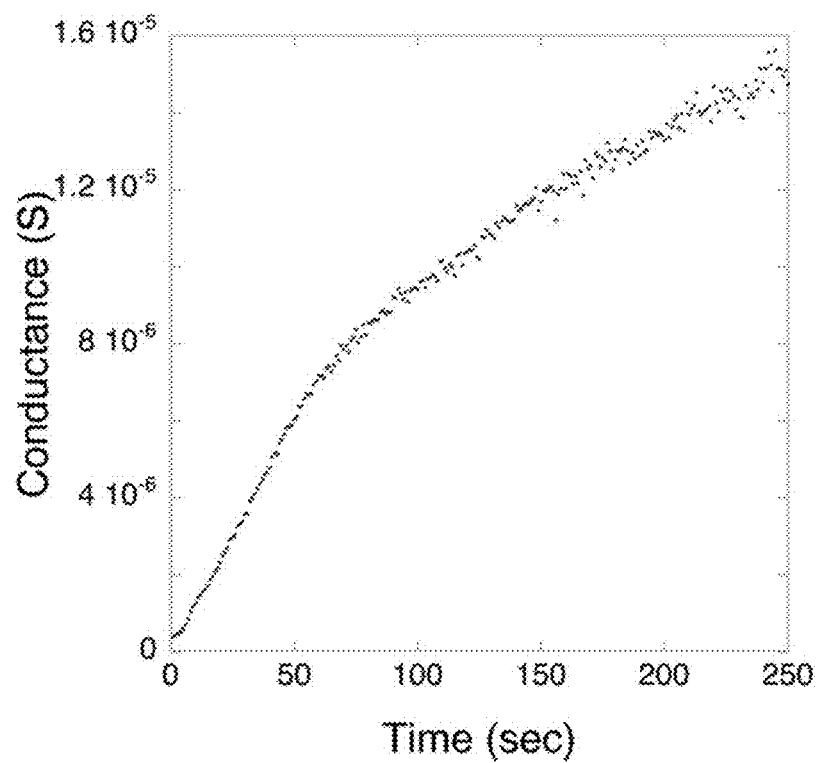
FIG. 11: Conductance versus time for a $WO_3$-on-YSZ sample measured under constant field conditions. The behavior is qualitatively the same as that of $In_2O_3$-on-YSZ samples. At time=0, the sample was exposed to a constant potential of 15.0 V between electrodes 131 and 137 (two-point measurement, electrode geometry shown in FIG. 1) at 350° C. in a $pO_2$=1.5 Torr atmosphere.

As seen in FIG. 3D, the voltage component that develops across the $In_2O_3$/YSZ heterointerface is largest nearest the negative electrode (electrode 131 in FIG. 1) and decreases approximately linearly with increasing distance from that electrode. As a result, both the magnitude of the oxygen vacancy doping and the resulting field-induced conductance enhancement of the $In_2O_3$ film show a gradient laterally across the sample, with the largest increase in conduction occurring nearest the negative electrode. This was confirmed by measuring the voltage drop between adjacent electrodes with a constant potential between the end electrodes (FIG. 8) or with a constant current source (FIG. 9). A measured conductance gradient is shown in FIG. 10. When the direction of the driving current was reversed, measurements using electrode pairs nearest to the "new" negative electrode again developed the largest increase in conductance under field exposure, demonstrating the reversibility of the formation of the vacancy concentration gradient (FIG. 11). It should be noted that these observations rule out sample resistive heating as a cause of the enhanced conductance. Sample heating would be independent of current direction and would not produce a gradient.

Figure 4A:
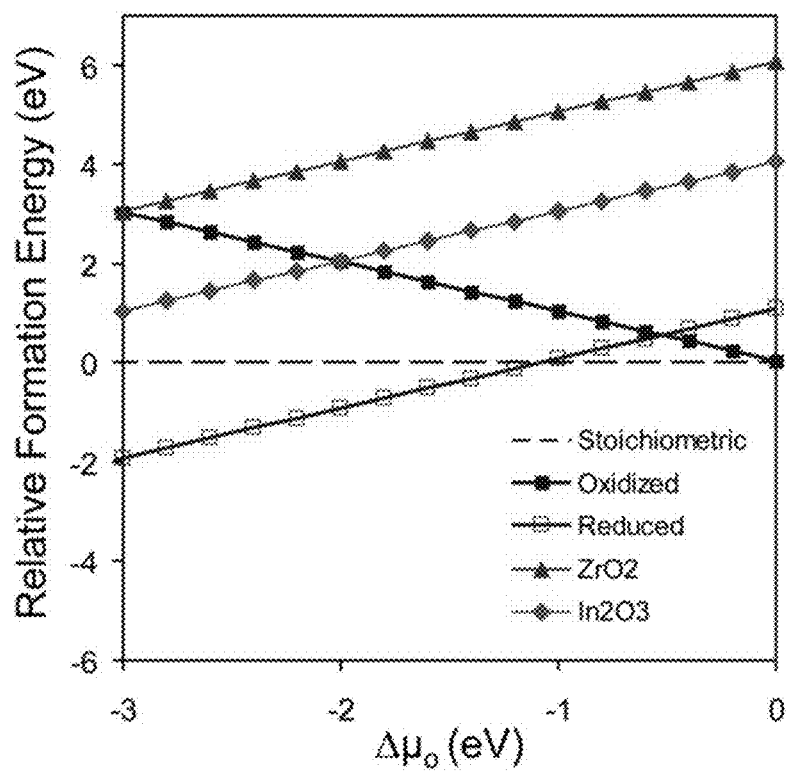
FIG. 4A: First principles calculations indicate that the formation energy of an oxygen vacancy is lower at the (001) $In_2O_3$—$ZrO_2$ interface than in either bulk material over a wide range of chemical potential change ($\Delta\mu_O$) values. Note that $\Delta\mu_O$ depends on $pO_2$ and temperature. For example, a typical experimental condition of $PO_2$=1.5 Torr and T=400° C. corresponds to $\Delta\mu_O$ of approximately −0.9 eV. Also, the formation energy of an oxygen vacancy at the interface depends on the starting interface oxygen composition. For typical experimentally accessible T and $pO_2$ conditions, including those of this study, stoichiometric (interface plane oxygen content equal to that of the average of the oxygen planes in $In_2O_3$ and $ZrO_2$) and reduced (interface plane oxygen content equal to that of the oxygen planes in $In_2O_3$) configurations are always predicted to have lower formation energies than an oxidized configuration (interface plane oxygen content equal to that of the oxygen planes in $ZrO_2$).
Figure 4B:
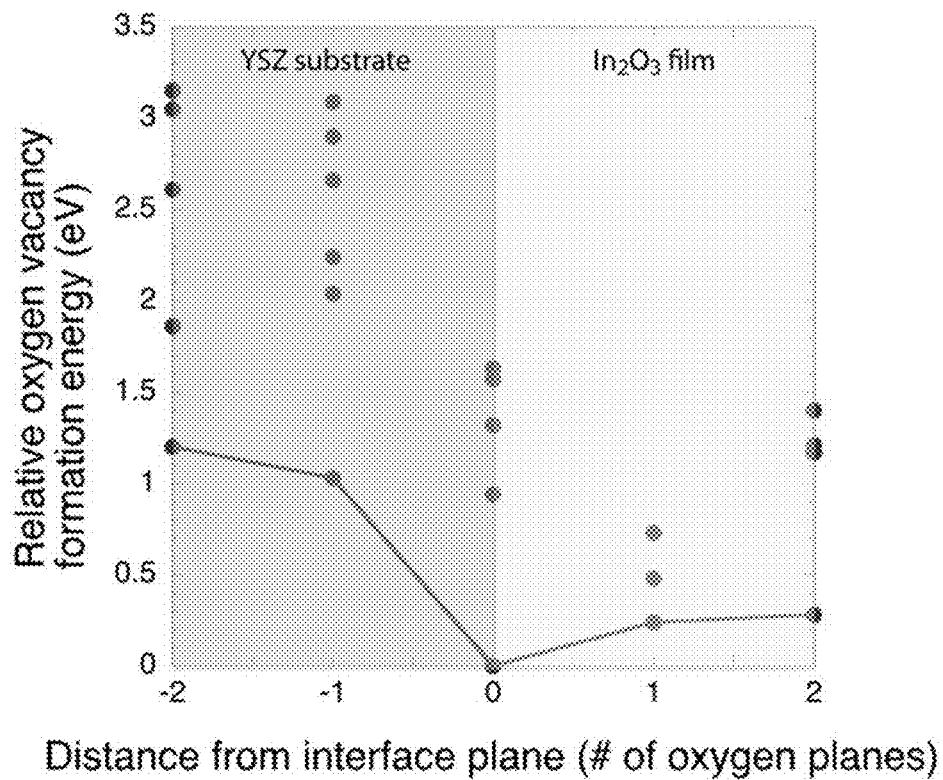
FIG. 4B: Based on first principles calculations, the formation energy associated with adding an oxygen vacancy to a YSZ-$In_2O_3$ supercell is predicted to be significantly lower for sites in the interface plane or adjacent to the interface in the $In_2O_3$ film than for sites in the YSZ substrate. Energies for multiple possible sites for an oxygen vacancy within each plane are shown. Points connected with a line correspond to the lowest energy positions of the vacancy in each plane. The formation energy values are relative to the energy of the lowest energy site in the heterostructure.

Further insight into the energetics of oxygen vacancies in $In_2O_3$/YSZ heterostructures was obtained from first-principles calculations. The atomic stacking normal to the (001) $In_2O_3$/YSZ interface alternates between cation and oxygen planes, with a shared oxygen plane at the interface. As seen in FIG. 4A, over a wide range of T and $pO_2$ conditions, the formation energy of an oxygen vacancy is predicted to be lower at the (001) $In_2O_3$—$ZrO_2$ interface than in either bulk material. We also examined the energetics of inserting an extra oxygen vacancy into the interface region of a (001) $In_2O_3$/YSZ heterostructure, to correlate with the behavior occurring when an electric field drives vacancies in YSZ towards the interface. As seen in FIG. 4B, it is energetically favorable for a vacancy to move from an oxygen plane near the interface in YSZ to the interface plane or to the adjacent oxygen plane in the $In_2O_3$ film. This will increase the vacancy concentration in $In_2O_3$, consistent with the experimentally observed doping effect. The predicted localization of vacancies to the $In_2O_3$ interface region is also consistent with the experimentally observed film thickness-dependent behavior discussed above.

In contrast to the behavior of $In_2O_3$/YSZ heterostructures, we find that heterostructures consisting of $In_2O_3$ films grown on $MgAl_2O_4$ substrates show no change in conductance in response to application of a DC field, and no change in conductance when the field polarity is reversed (FIG. 11). This indicates that, although the YSZ substrate conductance is low compared to that of the $In_2O_3$ film over the temperature range examined, the substrate nonetheless has a profound effect in controlling the heterostructure conduction behavior, both in establishing the voltage component normal to the heterointerface that provides the driving force for ion motion, and in serving as a source/sink of mobile oxygen vacancies/ions. $In_2O_3$/$MgAl_2O_4$ heterostructures do not show a field-induced conduction enhancement because the substrate in this case is not a fast oxygen ionic conductor with a large oxygen vacancy concentration.

We note that electric field-induced polarization has been observed to occur in many different mixed oxide conductors (i.e., oxides that exhibit both ionic and electronic conduction behavior), a manifestation of the well-known Hebb-Wagner polarization mechanism. However, the mechanism responsible for the behavior observed in the present study is not consistent with Hebb-Wagner polarization of $In_2O_3$. Hebb-Wagner polarization occurs in mixed conductors exposed to a DC field when ionic conduction is blocked by one of the current electrodes. Resultant polarization of the mobile ions may in turn locally alter the electronic conductivity, producing an electronic conductivity gradient. Hebb-Wagner polarization of $In_2O_3$ is not expected since $In_2O_3$ is not a mixed conductor. In fact, $In_2O_3$ has been successfully used as an oxygen-ion-blocking electrode in previous Hebb-Wagner polarization studies, and even when alloyed with $ZrO_2$, the ionic transference number of $In_2O_3$ is reported to be only on the order of $10^{-4}$. Also, the electrode arrangement used in the present experiment is symmetric (i.e., both the positive and negative current electrodes used in the present case were porous Pt paint, inconsistent with the requirement for Hebb-Wagner polarization that one current electrode block ion transport while the other current electrode allows both ion and electron transport). Most importantly, if Hebb-Wagner polarization of $In_2O_3$ were responsible for the field-induced conduction enhancements observed in the present study, we would also expect to see polarization behavior in $In_2O_3$ films grown on $MgAl_2O_4$ substrates. This is not the case. We also note that, while Hebb-Wagner polarization of YSZ has been reported, the electronic conductance of YSZ is insignificant compared to the magnitude of the measured conductance changes of the samples used in the current study (and the electronic component of the conduction of YSZ is dominantly p-type, in contrast to the observed n-type character of the present samples).

The controllable dynamic doping achieved with application of a small lateral electric field demonstrated in this study should be possible in a wide variety of heterostructures. For example, we have also recently observed similar DC field-induced electrical conduction enhancement in heterostructures consisting of $SrTiO_3$ or $WO_3$ films grown on YSZ substrates (FIG. 12). If the heterostructure consists of a film that can be electronically doped by a mobile ion in the substrate, controllable field driven conductivity should generally be possible. Controllable dynamic doping of the carriers in the electronic conductor can be achieved reversibly, without cation doping or changing the gas environment in contact with the sample, by simply passing a current through the sample parallel to the heterointerface if the field profile in the ionically conducting substrate differs from the profile in the electronically conducting film. This requires that electrode contact resistances in film and substrate are dissimilar, a condition commonly satisfied.

While we have focused in this study on using oxygen vacancy doping to control electrical conduction behavior in a model thin film heterostructure, we expect that similar heterostructures can be designed and synthesized to control other types of behaviors via oxygen vacancy doping using small electric fields. The approach of using small electric fields to oxygen-vacancy dope heterostructures, which consist of a fast oxygen ion conductor with an electronically conducting functional oxide in a thin film, thus provides a new and unexplored opportunity to tune properties and achieve emergent behavior.

Methods

Epitaxial $In_2O_3$ films with thicknesses ranging from 4 to 70 nm were deposited by RF sputtering on single crystal (001) YSZ or $MgAl_2O_4$ substrates with dimensions 1×1 $cm^2$×1 mm thickness. The substrate temperature was typically 800° C. and typical growth rates were approximately 10 nm per hour. Sample thickness was characterized using x-ray reflectivity. X-ray diffraction indicated that the films had the expected orientation relation: (001) $In_2O_3$∥(001) YSZ, and [100] $In_2O_3$∥[100] YSZ.

Samples had parallel line Pt electrodes sputter-deposited through a shadow mask onto the $In_2O_3$ film surface and, in some cases, also on the back surface of the substrate. End electrodes were applied using Pt paint. Electrical measurements were made using an environmental probe station, at controlled temperature and $pO_2$. Mass flow controllers were used to mix Ar and $O_2$ gases to achieve desired $pO_2$, at a typical total chamber pressure of 150 Torr. Most measurements were made at $pO_2$=1.5 Torr, at temperatures between 150 and 600° C. DC fields were applied through Pt-coated probe tips in contact with the sample Pt electrodes, using a Keithley Model 2400 source meter. Conduction measurements were typically made in four-point geometry, driving current between the end electrodes and measuring the conductance between a pair of voltage pick-off electrodes on the film surface, under either fixed voltage or fixed current conditions (consistent behavior was observed for both conditions). Some measurements were made using the top electrodes both as the current source/sink electrodes and as voltage pick-offs; similar results were obtained in those cases as when the end electrodes were used as the current source/sink electrodes. Measurements of the voltage across the $In_2O_3$/YSZ heterointerface were made by applying a fixed voltage between the end electrodes (FIG. 1) using a battery, while using the source meter to monitor the voltage between one electrode on the surface of the film and a parallel electrode on the backside of the substrate.

Computational studies used density functional theory within the generalized gradient approximation as implemented in VASP, with Perdew-Wang exchange-correlation functionals and Projected Augmented Wave potentials. Periodic supercell configurations were analyzed, with two interfaces per supercell (each interface is a shared plane of oxygen ions). Two configurations were considered: (1) a flat $In_2O_3$ cation plane adjacent to the interface, with In ions occupying two sites (8b and 24d), and (2) a buckled $In_2O_3$ cation plane adjacent to the interface, with In atoms only occupying 24d sites. $In_2O_3$—$ZrO_2$ supercells contained three layers of $ZrO_2$ and five layers of $In_2O_3$ (with 8 cations in each layer). Structural minimization was performed allowing all the atoms and the supercell in the (001) direction to relax, while keeping the other two dimensions fixed at the bulk value. $In_2O_3$-YSZ supercells were comprised of five layers of YSZ and five layers of $In_2O_3$. Each YSZ cation layer contained 6 Zr ions and 2 Y ions, corresponding to a YSZ stoichiometry equivalent to $6ZrO_2$—$Y_2O_3$. Y ions were distributed in the cell following the approach of a previous computational study.

Embodiments herein described can be utilized with various functions. For example, oxygen vacancy doping can be used to control properties other than electrical conduction, such as chemical reactivity, magnetic properties, or optical properties. Further, particular applications may involve gas sensors, catalysis, separation membranes, superconducting devices, and magnetic devices.

As used herein, the singular forms "a," "an," and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes, and omissions may also be made in the design, operating conditions, and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

We claim:

1. A method of controlling oxygen vacancy distribution in a hetero structure, comprising:
   applying an electric field to the heterostructure, the heterostructure having an oxygen ion conductor substrate and an oxide semiconductor layer with an interface there between, with a first electrode at a first end in contact with both the oxygen ion conductor substrate and the semiconductor layer and a second electrode at a second end in contact with both the oxygen ion conductor substrate and the semiconductor layer;
   moving oxygen ions from the oxide semiconductor layer to the oxygen ion conductor substrate;
   developing an applied current moving parallel to a longitudinal axis of the interface from the first electrode to the second electrode;
   developing a voltage component orthogonal to the applied current;
   wherein the conductance of the oxide semiconductor layer is increased by application of the electric field.

2. The method of claim 1, wherein the oxide semiconductor layer is selected from the group consisting of $In_2O_3$, $SrTiO_3$, $VO_2$ or $WO_3$.

3. The method of claim 1, wherein the oxygen ion conductor substrate is selected from the group consisting of $Y_2O_3$ stabilized $ZrO_2$, Gd-doped $CeO_2$, Sr-doped $LaGaO_3$ and Mg-doped $LaGaO_3$.

4. The method of claim 1, wherein the oxide semiconductor layer is $In_2O_3$ which is grown on (001) and (111) surfaces of the oxygen ion conductor substrate consisting of $Y_2O_3$ stabilized $ZrO_2$.

5. The method of claim 1, further comprising developing a contact resistance between the first electrode and the semiconductor layer.

6. The method of claim 1, further comprising developing a Schottky resistance adjacent an interface of the second electrode and the oxygen ion conductor substrate.

7. The method of claim 1, further comprising removing the electric field, wherein oxygen ions move from the oxygen ion conductor substrate to the semiconductor and wherein the conductance of the oxide semiconductor layer decreases upon removal of the electric field.

8. A method of controlling oxygen vacancy distribution in a hetero structure, comprising:
   applying an electric field to the heterostructure, the heterostructure having an $Y_2O_3$ stabilized $ZrO_2$ substrate and an oxide semiconductor layer with an interface there between, with a first electrode at a first end in contact with both the substrate and the semiconductor layer and a second electrode at a second end in contact with both the substrate and the semiconductor layer;
   moving oxygen ions from the oxide semiconductor layer to the substrate;
   developing an applied current moving parallel to a longitudinal axis of the interface from the first electrode to the second electrode;
   developing a voltage component orthogonal to the applied current; and
   altering a property of the oxide semiconductor layer while the electric field is applied.

9. The method of claim 8, wherein the altered property is selected from the group consisting of electrical conduction, chemical reactivity, magnetic properties, and optical properties.

10. The method of claim 8, wherein the oxide semiconductor layer is selected from the group consisting of $In_2O_3$, $SrTiO_3$, $VO_2$ or $WO_3$.

11. The method of claim 8, further comprising developing a contact resistance between the first electrode and the semiconductor layer.

12. The method of claim 8, further comprising developing a Schottky resistance adjacent an interface of the second electrode and the substrate.

13. The method of claim 8, further comprising removing the electric field, wherein oxygen ions move from the oxygen ion conductor substrate to the semiconductor and wherein the conductance of the oxide semiconductor layer decreases upon removal of the electric field.

* * * * *